United States Patent [19]

Feldman et al.

[11] Patent Number: 5,283,152
[45] Date of Patent: Feb. 1, 1994

[54] SELF-CONTAINED IMAGING SHEET USEFUL FOR REPRODUCING IMAGES ON PLAIN PAPER AND METHOD THEREFOR

[75] Inventors: Lyudmila Feldman, Appleton, Wis.; David A. Gobran, Woodbury, Minn.; Carol L. Inskeep, Miamisburg, Ohio

[73] Assignee: The Mead Corporation, Dayton, Ohio

[21] Appl. No.: 831,899

[22] Filed: Feb. 6, 1992

[51] Int. Cl.$^5$ .................................. G03C 1/72
[52] U.S. Cl. ...................... 430/138; 430/202; 430/211; 430/252; 430/253; 430/256; 430/260; 430/292; 503/226; 503/214; 503/215
[58] Field of Search ............... 430/138, 203, 202, 211, 430/252, 253, 254, 257, 260, 281, 350, 353, 292, 235, 256; 503/214, 215, 226

[56] References Cited

U.S. PATENT DOCUMENTS

| | | | |
|---|---|---|---|
| 4,440,846 | 4/1984 | Sanders et al. | 430/138 |
| 4,508,807 | 4/1985 | Adair | 430/138 |
| 4,622,282 | 11/1986 | Head et al. | 430/158 |
| 4,751,165 | 6/1988 | Rourke et al. | 430/138 |
| 4,766,050 | 8/1988 | Jerry | 430/138 |
| 4,841,338 | 6/1989 | Suzuki | 355/27 |
| 5,043,314 | 8/1991 | Suzuki et al. | 430/138 |

FOREIGN PATENT DOCUMENTS

| | | | |
|---|---|---|---|
| 0260129 | 3/1988 | European Pat. Off. | 430/138 |
| 2202641 | 9/1988 | United Kingdom . | |
| 2204142 | 11/1988 | United Kingdom | 430/138 |

*Primary Examiner*—Marion E. McCamish
*Assistant Examiner*—Janis L. Dote

[57] ABSTRACT

A self-contained imaging sheet comprising in order:
(a) a support;
(b) a first layer comprising photosensitive microcapsules having an internal phase, said internal phase comprising an image forming agent and a photosensitive composition which undergoes a physical transformation in response to exposure to actinic radiation;
(c) a second layer comprising a developer material; and preferably
(d) a third layer comprising an adhesive forming component, said self-contained imaging sheet being useful in forming images on plain paper by a process which comprises imagewise exposing said imaging sheet to actinic radiation, forming an image on said developer material, transferring the image bearing developer layer to said plain paper, and separating said imaging sheet from said plain paper, wherein said image bearing developer layer remains adhered to said plain paper and said microcapsule layer remains adhered to said support.

11 Claims, 4 Drawing Sheets

SELF-CONTAINED IMAGING SHEET USEFUL FOR REPRODUCING IMAGES ON PLAIN PAPER AND METHOD THEREFOR

BACKGROUND OF THE INVENTION

1. Field of Invention

The present invention relates to a novel self-contained imaging sheet which carries (1) a layer of microcapsules containing a photosensitive composition and an image forming agent and (2) a developer material on the surface of a support. More particularly, it relates to a self-contained imaging sheet wherein the layer of microcapsules is present as a first layer on one surface of the support and the developer material is present as a second layer contiguous with the first layer of microcapsules, and to a process for reproducing images on plain paper using the novel self-contained imaging sheet.

2. Prior Art

U.S. Pat. No. 4,399,209 to The Mead Corporation describes a transfer imaging system wherein an imaging sheet comprising a support and a layer of microcapsules containing a chromogenic material and a photosensitive composition is imagewise exposed to actinic radiation. The exposed sheet is assembled with a developer sheet and the two are passed through a calendar nip whereupon the microcapsules rupture and the contents of the microcapsules are image-wise transferred to the developer sheet where they react and form a colored image.

Typically, the photosensitive composition is a photocurable composition containing an ethylenically unsaturated compound and a photoinitiator. The Chromogenic material is a substantially colorless electron-donating color former, and the developer is an electron-acceptor such as an aromatic carboxylic acid salt which is capable of reacting with the color former and forming a visible dye image. Upon image-wise exposing the imaging sheet to actinic radiation, the internal phase of the microcapsules is hardened in the exposed areas. The internal phase remains liquid in the unexposed areas and may be hardened to an intermediate degree in areas receiving an intermediate level of exposure. Thus, the microcapsules in the unexposed areas are capable of rupturing and releasing the internal phase upon subjecting the exposed imaging sheet to a uniform rupturing force. The microcapsules in the underexposed areas may rupture and release the internal phase to an intermediate degree, however, in the exposed areas, the hardened photosensitive composition prevents the microcapsules from releasing the internal phase. In this manner, the internal phase of the microcapsules is image-wise released and transferred to the developer sheet where the image is formed.

While the transfer imaging system described in U.S. Pat. No. 4,399,209 can be used in numerous formats and applications, the user usually must purchase two coated paper products to reproduce images; namely, the imaging sheet and the developer sheet. This has several disadvantages. If the imaging sheet and the developer sheet are not designed to be used together, image quality may not be up to standard. More importantly, the developer sheet does not have the appearance, tactility, and other physical properties found in office bond paper.

U.S. Pat. No. 4,701,397 to The Mead Corporation relates to a process for forming images on plain paper by image area-wise transfer of a self-contained coating comprising a developer-containing resin and a microencapsulated photosensitive composition containing a color former. The developer-containing resin is provided on an imaging sheet in the same layer as a microencapsulated photosensitive composition or it may be provided as a separate contiguous layer. Images are formed by image-wise exposing the imaging sheet to actinic radiation, assembling the imaging sheet with a sheet of plain paper, heating the assembly, and subjecting the assembly to a uniform rupturing and transfer force. Upon heating and application of the rupture and transfer force, the microcapsules image-wise release the internal phase, the color former reacts with the developer and the image areas become adhered to the plain paper's surface. Upon separating the imaging sheet from the plain paper, the image areas are selectively transferred to the plain paper while the non-image areas remain adhered to the imaging sheet. both color former and developer-containing resin are transferred, as a unit, to the paper sheet.

U.S. Pat. No. 4,751,165 to The Mead Corporation is a continuation-in-part of the above-mentioned U.S. Pat. No. 4,701,397 and relates to the imaging sheet described in the parent case.

U.S. Pat. No. 4,865,938 to Brother relates to photo and pressure recording media which may consist of a self-contained imaging sheet wherein an adhesive member is added to the configuration of the imaging sheet. No consideration is given to placing the developer resin on top of the capsule layers and using modifications of this layer to produce a pressure activated adhesive.

U.S. Pat. No. 4,766,050 to The Mead Corporation relates to a photosensitive material having a support, an opacifying layer, a layer containing microcapsules and a layer of developer material. The layers are positioned such that upon rupturing the microcapsules, the color former diffuses to the developer layer to form an image therein. The final image is viewed against the opacifying agent which provides a white background.

U.S. Pat. Nos. 4,440,846; 4,508,807 and 4,622,282 and U.K. Pat. Appln. 2 202 641 A all disclose self-contained imaging sheets wherein the developer resin and photosensitive microcapsules are in the same layer or the developer resin is contained between the support and the microcapsule layer.

The inefficient configuration of the layers on the imaging sheet and, more importantly, the need for application of heat to induce adhesion to the paper in the above prior art cause poor image discrimination and clarity. Furthermore, capsule fragments of ruptured microcapsules are inadvertently transferred to the new base together with the developer resin. This is particularly undesirable when preparing OHP transparencies because of haze introduced by light scattering caused by broken and possibly unbroken capsules. Another problem occurs when capsules contain colored species such as dyes, pigments or colored photoinitiators. These capsules must not be transferred because the coloration will interfere with Dmin and other low color density areas in the final print.

SUMMARY OF THE INVENTION

An object of the present invention is to provide a self-contained imaging sheet which is useful in forming images on plain paper. More particularly, the self-contained imaging sheet comprises in order: a support; a first layer of photosensitive microcapsules containing, as an internal phase, an image forming agent and a photosensitive composition which undergoes a physical change in response to exposure to actinic radiation; and a second separate layer of developer material contiguous with the microcapsules layer. The imaging sheet further contains a pressure sensitive adhesive component which may be effectively dispersed in the developer layer, or it may be coated on the imaging sheet as a separate layer contiguous with the developer layer. In the first configuration, the developer layer containing the pressure sensitive component represents one surface of the imaging sheet and the support is the other surface with the microcapsule layer sandwiched in between. In the second configuration, the pressure sensitive adhesive represents a surface of the imaging sheet and the support is the other surface. In this configuration both the microcapsule layer and the developer material, as individual layers contiguous to each other, are sandwiched between the support and adhesive layers with the microcapsule layer and the developer layer juxtaposed between the support and the pressure sensitive layers, respectively.

Another object of the present invention is to provide a process for forming images on plain paper employing the above imaging sheet wherein the images have improved image discrimination, clarity, and density and reduced mottle.

Accordingly, one manifestation of the present invention resides in a self-contained imaging sheet comprising in order:

(a) a support;

(b) a first layer comprising photosensitive microcapsules having an internal phase, said internal phase comprising an image-forming agent and a photosensitive composition which undergoes a physical transformation in response to exposure to actinic radiation; and (c) a second layer comprising a developer material, said self-contained imaging sheet being capable of forming images on plain paper by a process which comprises image-wise exposing said imaging sheet to actinic radiation, forming an image on said developer material, transferring the image bearing developer layer to said plain paper, and separating said imaging sheet from said plain paper, wherein said image bearing developer layer remains adhered to said plain paper and said microcapsule layer remains adhered to said support.

An additional manifestation of the present invention is the self-contained imaging sheet which further comprises a third layer (d) comprising an adhesive material.

Another manifestation of the present invention is a process which comprises image wise exposing the imaging sheet to actinic radiation, forming an image on said developer material, transferring the image bearing developer layer to said plain paper, and separating said imaging sheet from said plain paper, wherein said image bearing developer layer remains adhered to said plain paper and said microcapsule layer remains adhered to said support.

Yet another manifestation of the present invention is the process wherein said exposed imaging sheet is assembled with said plain paper, said assembly being subjected to heat and a uniform pressure to effectively cause simultaneous development of an image on said developer layer and transfer of said developer layer to said plain paper. The image obtained exhibits improved image discrimination, clarity and image density.

Still another manifestation of the present invention is the process which comprises the following steps:

(i) image wise exposing said imaging sheet to actinic radiation, (ii) applying a rupture-effective pressure to said exposed imaging sheet causing said microcapsules to rupture in the image areas such that said internal phase is released from said microcapsules in the image areas wherein said image forming agent reacts with said developer material to form an image thereon, (iii) assembling said imaging sheet with said plain paper such that said third layer is juxtaposed said plain paper.

(iv) applying an adhesion-effective pressure to said assembly causing said image bearing developer layer to adhere to said plain paper, and (v) separating said assembly wherein said image bearing developer layer remains adhered to said plain paper, said image exhibiting enhanced image discrimination and clarity, and said microcapsule layer remains adhered to said support. Preferably subjected to a glossing step conducted at a temperature of about 100 to 150° C. in an oven or in a set of glosser rollers. The image-bearing plain paper may be The image thus obtained exhibits reduced mottle as well as improved image discrimination, clarity and image density.

DEFINITIONS

The term "microcapsules" as used herein includes microcapsules having a discrete wall, microcapsules formed by dispersing droplets of a radiation curable composition in a binder, or an open porous matrix as disclosed in U.S. Pat. No. 4,912,014.

The term "actinic radiation" includes the entire electromagnetic spectrum including ultraviolet, visible and infrared radiation, X-rays, and particle radiation such as ion beam radiation.

The term "plain paper" as used herein refers to paper, film, board and the like which does not have a developer composition or similar reactive material associated with it. It is not meant, however, to exclude substrates which are sized or otherwise surface treated to enhance transfer of the developer, limit feathering or penetration, enhance adhesion or affinity for the developer, etc. A particularly convenient paper is xerographic bond paper.

DETAILED DESCRIPTION OF THE INVENTION

Figure 1A:
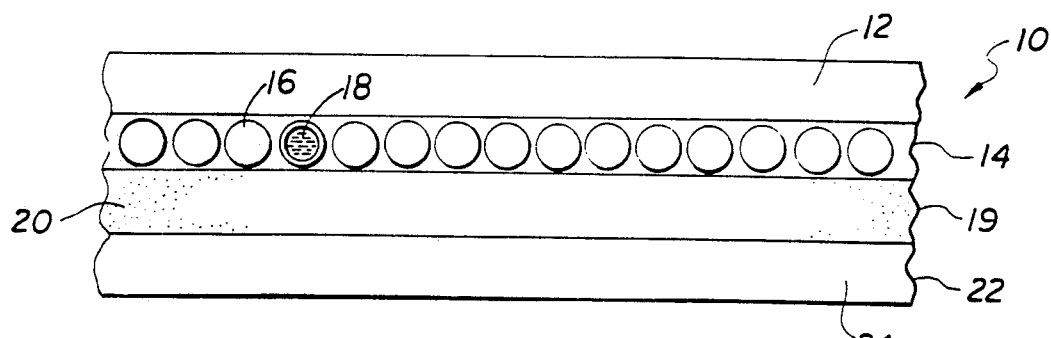
FIGS. 1a-1c are cross-sectional schematic views of three self-contained imaging sheets of the present invention showing various modifications of the third layer.

FIG. 1a illustrates the present invention wherein the imaging sheet is generally designated by the numeral 10. The imaging sheet 10 includes a support 12 having a photosensitive layer 14 on the surface thereof. The layer 14 includes photosensitive microcapsules 16 having a liquid internal phase 18. A second layer 19 consists of the developer material 20 which, preferably, is present in the form of a finely divided resin. A third layer 22 is illustrated in FIG. 1a, as comprising a continuous medium 24 composed from a single material or a homogeneous blend of at least two different materials which serve as an adhesive layer.

Figure 1B:
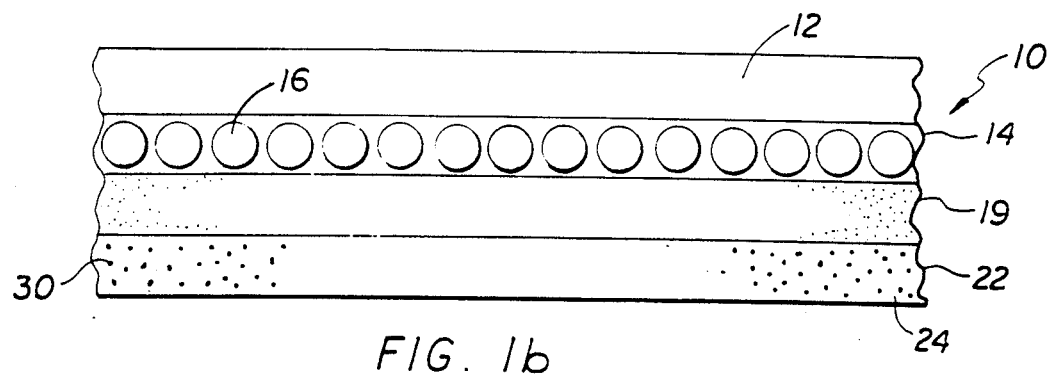
Figure 1C:
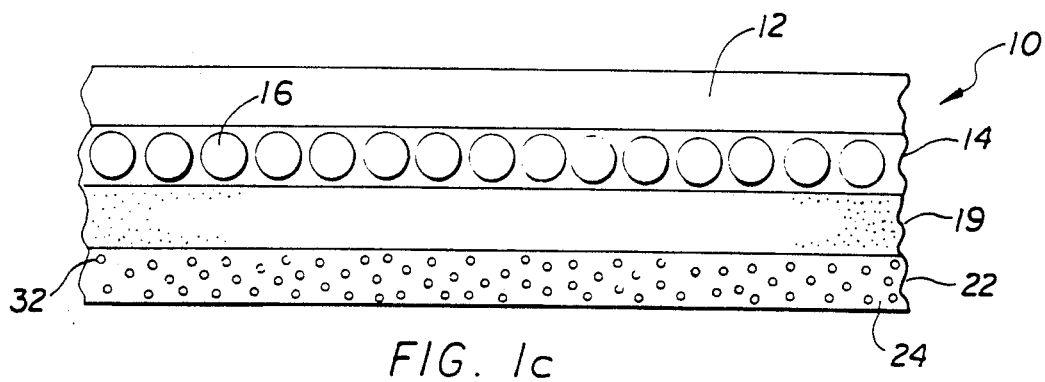

The continuous medium 24 may be modified by dispersing therein additives such as plasticizers, activators, etc. in the form of solid particles 30 as illustrated in FIG. 1b or liquid-containing microcapsules 32 as illustrated in FIG. 1c. It is anticipated that the additives dispersed in the continuous medium may be characterized as being solid, liquid or having a physical form ranging anywhere between solid and liquid. It is further anticipated that a combination of additives may be employed and that the physical forms of the additives may be similar or different.

Various materials including developer resin may be useful in forming the third layer. These materials are more fully described herein below. When developer material is chosen to be the base material in the third layer, it is preferably modified by the addition of an adhesion promoting material. The promoter material may be a tackifier, plasticizer or other resin having a Tg which may be lower or higher than the developer base resin. Generally, when the developer resin has a high Tg, the promoter will have a lower Tg, and when the developer resin has a low Tg, a promoter having a higher Tg will be selected. The advantage of this configuration is that the resin and promoter can be combined to produce a blend having the desired properties. The promoter material may be present in the form of a solid or as liquid-containing microcapsules.

Figure 2:
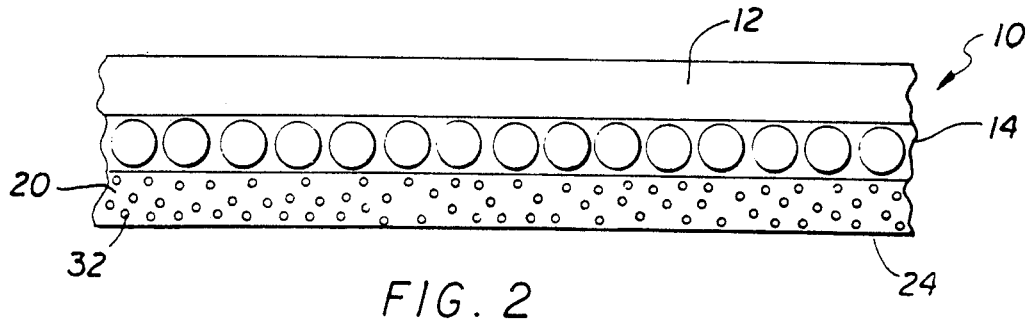
FIG. 2 is a cross-sectional schematic view of a self-contained imaging sheet wherein the developer material containing an adhesive promoting modifier represents the top layer of the self-contained imaging sheet.

FIG. 2 illustrates the present invention wherein the developer material 20 containing an additive to enhance adhesion properties is the top layer which is to be juxtaposed to the plain paper (not shown) and a third layer is not employed. Such configuration may be used in special formulations, but generally a third layer is preferred.

Figure 3:
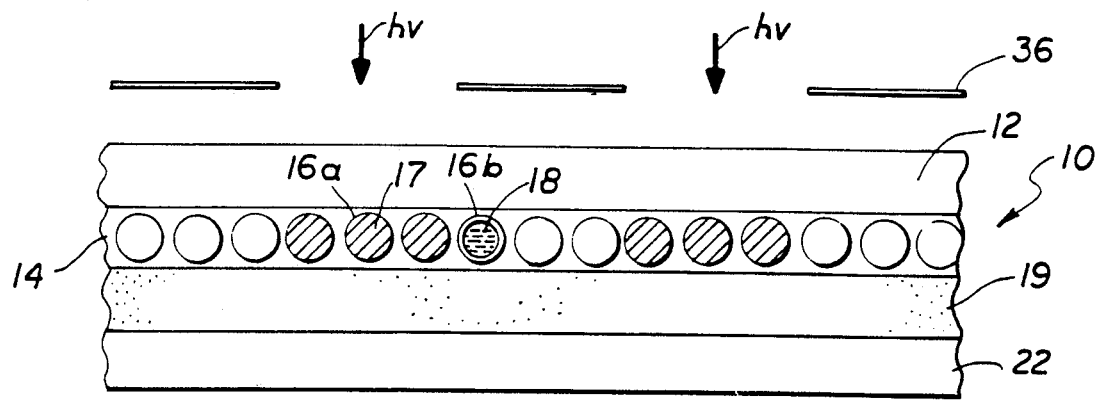
FIG. 3 is a cross-sectional schematic view of the self-containing imaging sheet of any of FIGS. 1a-1c after exposure to actinic radiation.
Figure 4:
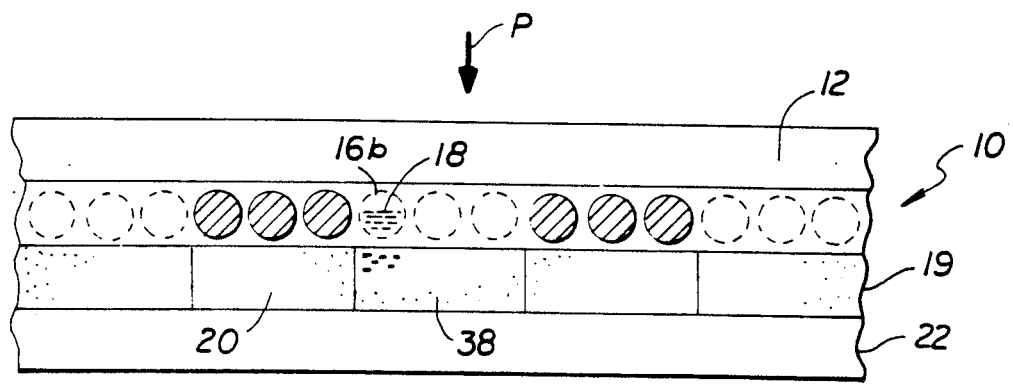
FIG. 4 is a cross-sectional schematic view of the self-contained imaging sheet of any of FIGS. 1a-1c after the imagewise transfer of the image forming agent to the developer layer.

FIG. 3 illustrates exposure of the imaging sheet 10 to actinic radiation (hv) through a mask 36. Exposure has the effect of solidifying the internal phase 17 of the microcapsules 16a in the exposed areas, whereas, the internal phase 18 of the microcapsules 16b in the unexposed areas remain liquid. Upon the application of pressure P to the imaging sheet 10, the microcapsules 16b rupture releasing the liquid internal phase 18 as shown in FIG. 4. The internal phase transfers and disperses into the developer material 20 where the image forming agent present in the internal phase 18 reacts with the developer material 20 to form an image area 38 therein. With regard to the change in the physical form of the internal phase 18 from liquid to solid upon exposure to actinic radiation, those skilled in the art will appreciate that the change in the internal phase may be from a liquid to a semi-solid form, from a semi-solid to a more solid form, or from a solid form to a liquid or less solid form, in which case the image will be a negative image.

Figure 5:
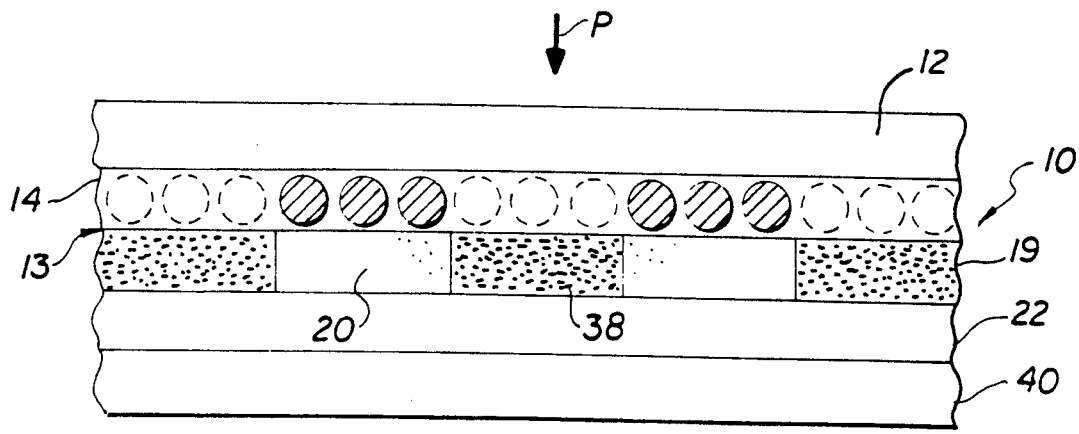
FIG. 5 is a cross-sectional schematic view of the self-contained imaging sheet of any of FIGS. 1a -1c after assembly with a sheet of plain paper.

After exposure and rupture of the microcapsules 16b causing the transfer of the internal phase 18 of microcapsules 16b with subsequent reaction of the image forming agent of internal phase 18 with developer material 20 to form image area 38, the imaging sheet is assembled with a sheet of plain paper 40 and subjected to a second pressure P' causing the third layer 22 which serves as an adhesive layer to adhere to the sheet of plain paper 40 as illustrated in FIG. 5.

Figure 6:
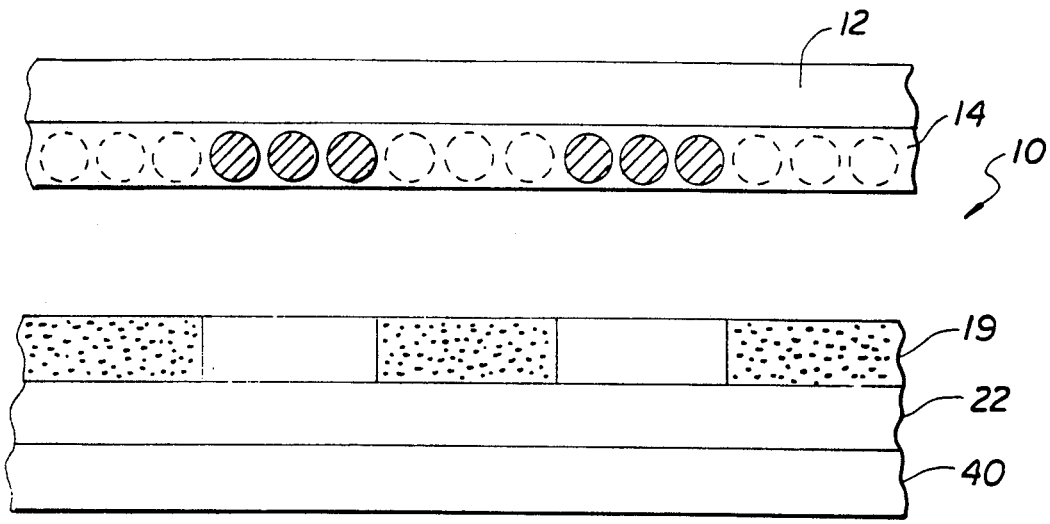
FIG. 6 is a cross-sectional schematic view of the self-contained imaging sheet of any of FIGS. 1a-1c after the imaging sheet is separated from the plain paper.

Following application of the second pressure P' causing adhesion of third layer 22 to the sheet of plain paper 40, the imaging sheet 10 is separated at the interface 13 of the microcapsule layer 14 and the developer layer 19. The developer layer 19 adheres to the plain paper 40 with the adhesive layer 22 residing therebetween while the microcapsule layer 14 remains attached to the support 12 as illustrated in FIG. 6.

Figure 7:
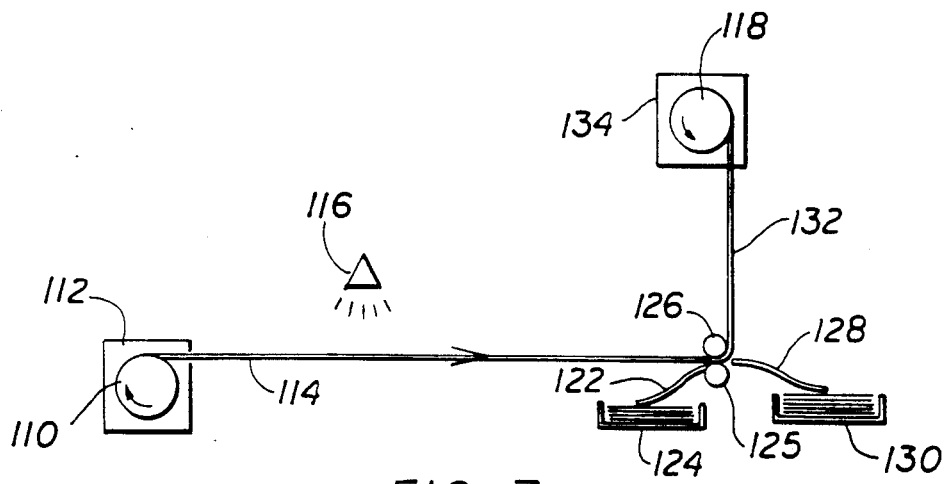
FIGS. 7-10 are schematic illustrations of four different apparatuses useful in carrying out the present invention.

FIG. 7 is a schematic illustration of an apparatus useful in carrying out the present invention in which the self-contained imaging sheet is exposed through its backside. That is to say, the sheet is exposed through the support which must be transparent to the actinic radiation employed. Preferably, the support is a transparent film such as polyethylene terephthalate. As shown in FIG. 7, there is provided a sheet-supply roller 110 contained in a housing structure 112 such as a cassette from which the rolled up self-containing imaging sheet 114 is supplied. The self-contained imaging sheet 114 is released from sheet-supply roll 110 and transported in the direction shown by the arrow. The self-contained imaging sheet 114 is image-wise exposed through its backside, i.e., through the support to actinic radiation from a source 116. The exposed imaging sheet 114 is assembled with a sheet of plain paper 122 supplied from a paper supply tray 124 and the assembly passed through the nip between pressure rollers 125 and 126 for simultaneously developing the image and transferring the developer layer to the sheet of plain paper 122. The sheet of plain paper 122 having the image-bearing developer layer transferred and adhered thereto provides a plain paper copy 128 which is collected in a paper-collecting tray 130. The spent sheet 132 is collected on take-up roll 118 contained in a housing structure 134 such as a cassette.

Figure 8:
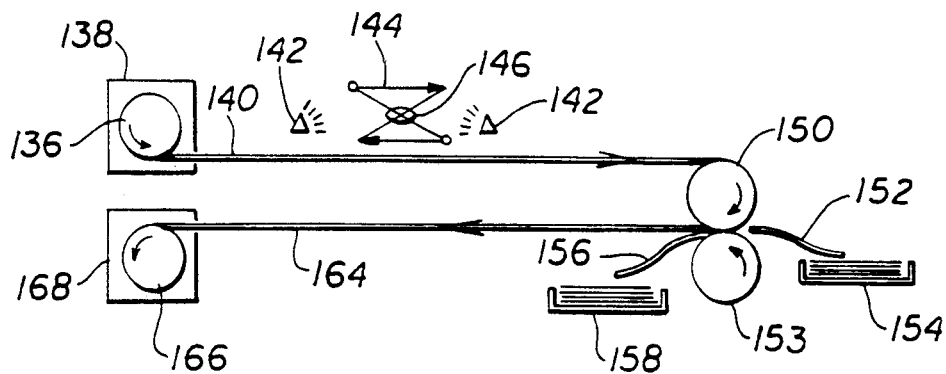

FIG. 8 is a schematic illustration of an alternate apparatus useful in practicing the present invention in which front-side exposure is employed. As shown in FIG. 8, a self-contained imaging sheet 140 is provided from supply roll 136 contained in housing structure 138. The imaging sheet 140 is released from supply roller 136 and transported in the direction shown by the arrow. In this particular illustration, the imaging sheet 140 is image-wise exposed by a means for exposing the surface of the imaging sheet through the front side, i.e., through the diffusive layers of adhesive and developer resins. Preferably, the exposing means consists of radiation sources 142 for photo-scanning a surface of an original 144 and an optical lens 146 for focusing the scanned radiation onto the front surface of the imaging sheet 140. The exposed imaging sheet 140 is assembled with a sheet of plain paper 152 provided from a paper supply tray 154 and the assembly passed through the nip between pressure rollers 150 and 153 for simultaneously developing the image and transferring the developer layer to the sheet of plain paper 152. The sheet of plain paper 152 having the image-bearing developer layer transferred and adhered thereto provides a plain paper copy product 156 which is collected in a paper-collecting tray 158. The spent sheet 164 is collected on take-up roll 166 contained in housing structure 168.

Figure 9:
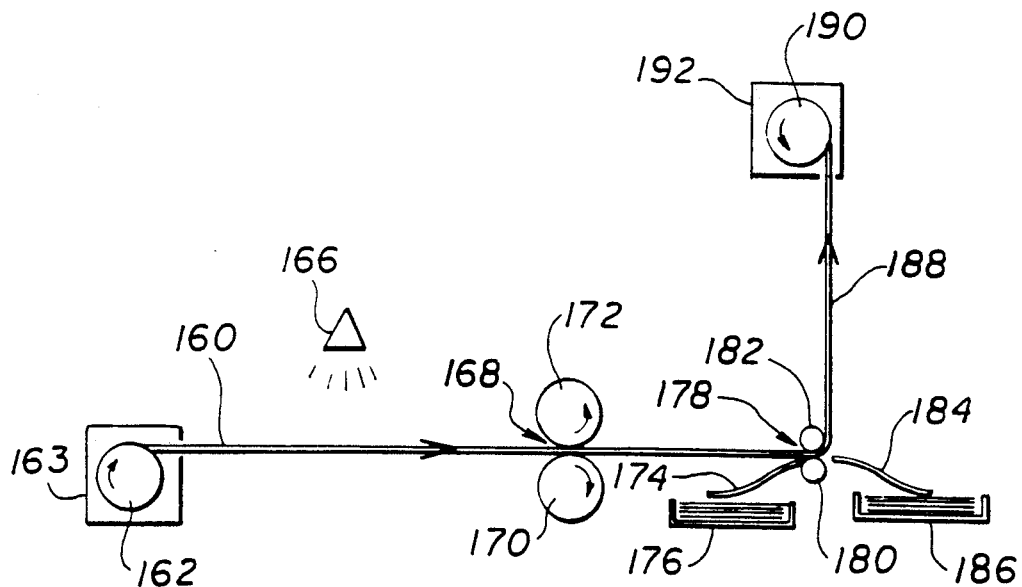

FIG. 9 is a schematic illustration of an apparatus useful in carrying out the present invention in two steps wherein the image is developed on the developer layer in a first step and the developer layer is transferred and adhered to the plain paper in a second step. In a manner similar to FIG. 7, the self-contained imaging sheet 160 is released from sheet-supply roll 162 contained in housing structure 163 and transported in the direction of arrow. The imaging sheet 160 is image wise exposed through its backside to actinic radiation from a source 166. The exposed imaging sheet 160 is then passed through the nip 168 between pressure rollers 170 and 172, each of which has a non-stick surface, for developing the exposed imaging sheet 160. The sheet 160 bearing the developed image is assembled with a sheet of plain paper 174 supplied from a paper supply tray 176 and the assembly passed through the nip 178 between pressure rollers 180 and 182 for transferring and adhering the developer layer to the sheet of plain paper 174. The sheet of plain paper 174 having the image bearing developer layer transferred and adhered thereto provides a plain paper copy 184 which is collected in a paper-collecting tray 186. The spent sheet 188 is collected on take-up roll 190 contained in a housing structure 192 such as a cassette.

Figure 10:
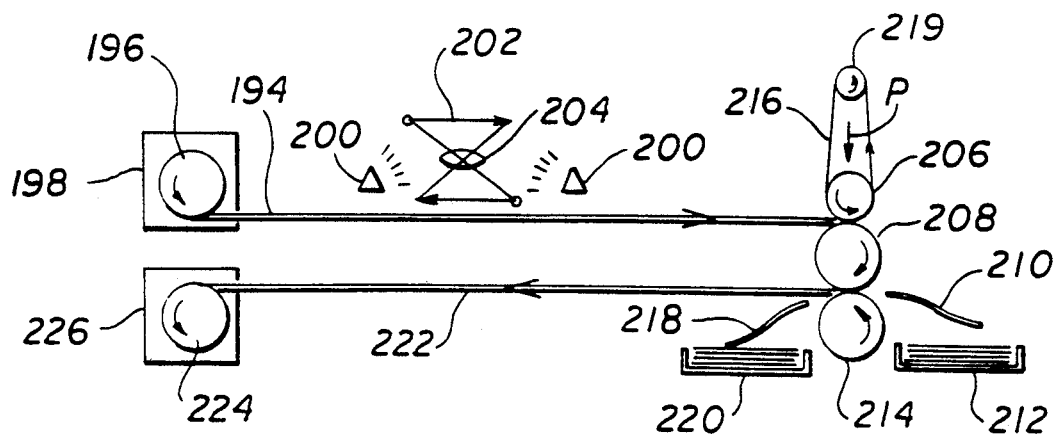

FIG. 10 is a schematic illustration of the apparatus useful in the present invention wherein the front-side of the imaging sheet is exposed. As shown in FIG. 8, a self-contained imaging sheet 194 is provided from supply roll 196 contained in housing structure 198. The imaging sheet 194 is released from supply roller 196 and transported in the direction of the arrow. In this illustration the imaging sheet 194 is image-wise exposed by a means for exposing the surface of the imaging sheet through the front side. Preferably, the exposing means consists of radiation sources 200 for photoscanning a surface of the original 202 and an optical lens 204 for focusing the scanned radiation onto the front surface of the imaging sheet 194. The exposed sheet 194 passes through the nip between pressure rollers 206 and 208 for developing under pressure the exposed imaging sheet 194. The sheet 194 bearing the developed image is assembled with a sheet of plain paper 210 provided from paper supply tray 212 and the assembly passed through the nip between pressure rollers 208 and 214 for transferring and adhering the developer layer to the sheet of plain paper 210. The surface of pressure roller 206 may be coated to provide a non-stick surface, or a belt 216 having a non-stick outer surface may revolve between rollers 206 and 219 in the direction of the arrow. The sheet of plain paper 194 having the image-bearing developer layer transferred and adhered thereto provides a plain paper copy product 218 which is collected in a paper-collecting tray 220. The spent sheet 222 is collected on the take-up roll 224 contained in housing structure 226.

With respect to FIGS. 7–10, it will be obvious to those skilled in the art that the adhesive surface of sheets 114, 140, 160 and 194 should have low enough tack so that they do not stick to the backside of the sheets when rolled up in a cartridge or, alternatively, the backside of the support may have a reduced-adhesion coating.

While the two-step method requires that the apparatus contain an additional set of rollers, it is the preferred method for carrying out the present invention. The two-step method is more adaptable to the use of paper or paper-like materials, i.e., materials which are porous or have uneven surfaces.

The advantage of the two-step method over the one-step method is that considerably less pressure is required to develop and transfer the image to the plain paper. This not only provides for reduced mottle appearance and for better image discrimination and clarity, but it also allows for reduced energy consumption to operate the apparatus. As an additional benefit, the construction of the apparatus for two-step operation is simpler and less costly since extremely high pressures are not required.

A critical feature of the present invention is in the clean separation of the developer resin which contains the image after development from the microcapsule layer which comprises non-ruptured microcapsules and fragments from ruptured microcapsules.

In accordance with the present invention, the self-contained imaging sheet comprises in order:

(a) a support;

(b) a layer of photosensitive microcapsules containing an internal phase which comprises an image forming agent and a photosensitive composition which undergoes a physical change, e.g., polymerization, crosslinking, or depolymerization upon exposure to actinic radiation; and (c) a layer of developer material which is capable of reacting with the image forming agent to form an image.

The self-contained imaging sheet further contains an adhesive member which may be incorporated directly into the developer layer. However, to allow more flexibility in the choice of materials, the adhesive member is preferably provided as a separate third layer (d) coated on the top surface of the developer layer (c). The separately coated adhesive layer which is now the outermost layer can be composed from a single resinous material or a blend of at least two different resins which inherently have sufficient adhesive characteristics, or this top resinous layer may be composed of a nonadhesive resin with relatively high Tg and practically no initial tack in which case the resin may be modified with various adhesive promoters interdispersed in the resin in the form of particles or microencapsulated fluids, or both, or it may have a multiphase morphology, e.g., core-shell or microsponge. During pressure development these modifiers are activated to provide adhesive characteristics to the resin. When liquids are used to promote pressure activated adhesion, special care needs to be taken to prevent migration of the liquids into other layers, especially if this migration might destroy the balance of relative adhesion strengths. Prevention of this problem requires careful selection of the type and quantities of each component in the adhesive layer.

In a preferred embodiment of the present invention, the self-contained imaging sheet comprises in order:

(a) a support;

(b) a layer of photosensitive microcapsules containing an internal phase which comprises an image forming agent and a photosensitive composition which undergoes polymerization or crosslinking upon exposure to actinic radiation;

(c) a layer of developer material which reacts with the image forming agent upon rupture of the microcapsules so that the image forming agent is released from the microcapsules and transfers to the developer layer to form an image thereon; and (d) an adhesive layer which effectively increases adhesion of the developer layer containing the image to plain paper.

It is critical for the imaging sheet to have the correct balance of adhesion strengths between the layers to provide successful transfer of the developer layer to the plain paper. For clean separation of the developer layer from the microcapsule layer, the adhesion between the microcapsules and the support and between the developer layer and the plain paper should be the strongest, and the adhesion between the microcapsules and the developer layer should be the weakest. The adhesion between the support and the microcapsules and between the developer and the plain paper should be equal so that any separation occurs only between the microcapsule layer and the developer layer.

The self-contained imaging sheet may be produced by a number of different methods. For example, the various layers may be formulated separately and added one on top of the other, sequentially, in separate passes; they may be formulated separately but coated and dried simultaneously; or a combination of these two methods may be employed. Moreover, the layered structure of the self-contained imaging sheet may be produced from a single coating of blended or dissolved materials in which a composition gradient develops due to a difference in diffusion rates, densities, and viscosities.

The developer materials used in the present invention are those conventionally employed in carbonless paper technology and are well known. Illustrative specific examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids such as zinc salicylate, tin salicylate, zinc 2-hydroxy naphthoate, zinc 3,5 di-tert butyl salicylate, oil soluble metal salts of phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120), zinc carbonate etc. and mixtures thereof.

A particularly preferred class of developer resins for use in the present invention is phenolic developer resins and,, more particularly, alkylated phenolic developer resins. These resins are the reaction products of formaldehyde and one or more phenols such as ortho- or para-substituted alkylphenols. The polymers are characterized in that they are thermoplastic, e.g., they have melting points in the range of about 100° C. to 180° C. The resins are preferably metallated, and particularly, zincated. Still more particularly, they are zincated products of the reaction of salicylic acid, alkylphenol and formaldehyde. They are often obtained and applied to the imaging sheet as aqueous emulsions or dispersions containing about 50% solids and having a particle size of about 1.5 to 2.0 microns.

Another class of phenolic resin useful in the present invention is the product of oxidative coupling of substituted or unsubstituted phenols or biphenols. Oxidative coupling may be performed using various catalysts but a particularly desirable catalyst is the enzyme, horseradish peroxidase. A particularly desirable phenolic resin is described in commonly assigned U.S. Pat. No. 4,646,952. A still more particularly useful resin is prepared by oxidative coupling Bisphenol A with hydrogen peroxide in the presence of horseradish peroxidase. This reaction can be carried out in a mixed solvent of water, acetone, and ethylacetate. After reaction the resin can be pulverized and ground in water with zinc salicylate and salicylic acid to prepare a finely divided particle useful in the present invention.

Another preferred phenolic developer is a condensation product of formaldehyde and an alkylphenol, such as an alkylphenol monosubstituted by an alkyl group which may contain 1 to 12 carbon atoms. Examples of alkyl phenols are ortho- or para-substituted ethylphenol, propylphenol, butylphenol, amylphenol, hexylphenol, heptylphenol, octylphenol, nonylphenol, t-butylphenol, t-octylphenol, etc. These resins are preferably metallated by reaction with a metal salt selected from the group consisting of copper, zinc, aluminum, tin, cobalt and nickel salts. Most typically, the resins are zincated to improve development. The metal content of the resins generally is about 1 to 5% by weight but may range up to 15%. Examples of these resins are provided in U.S. Pat. Nos. 4,173,684 to Stolfo and 4,226,962 to Stolfo.

Another class of thermoplastic phenolic developer material is a resin-like condensation product of a polyvalent metal salt, such as a zinc salt, and a phenol, a phenolformaldehyde condensation product, or a phenolsalicylic acid-formaldelhyde condensation product. Examples of this developer material are available from Schenectady Chemical Inc. under the designations HRJ 4250, HRJ 4252, and HRJ 4542. These products are reported to be a metallated condensation product of an ortho- or para-substituted alkylphenol, a substituted salicylic acid, and formaldehyde.

The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimiethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

The photohardenable compositions of the present invention can be encapsulated in various wall formers using techniques known in the area of carbonless paper including coacervation, interfacial polymerization, polymerization of one or more monomers in an oil, as well as various melting, dispersing, and cooling methods. To achieve maximum sensitivities, it is important that an encapsulation technique be used which provides high quality capsules which are responsive to changes in the internal phase viscosity in terms of their ability to rupture.

Urea-resorcinol-formaldehyde and melamine-formaldehyde capsules with low oxygen permeability are preferred. In some cases to reduce oxygen permeability, it is desirable to form a double walled capsule by conducting encapsulation in two stages.

A capsule size should be selected which minimizes light attenuation. The mean diameter of the capsules used in this invention typically ranges from approximately 1 to 25 microns. As a general rule, image resolution improves as the capsule size decreases. If the capsules become too small, they may disappear in the pores of the fiber of the substrate. These very small capsules may therefore be screened from exposure by the substrate. They may also fail to rupture when exposed to pressure or other rupturing means. In view of these problems, it has been determined that a preferred mean capsule diameter range is from approximately 3 to 10 microns. Technically, however, the capsules can range in size up to the point where they become visible to the human eye.

Image forming agents conventionally used in carbonless or pressure-sensitive systems are useful in the present invention. Particularly preferred image forming agents include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spriopyran compounds and the like. Cyan, magenta and yellow color precursors useful in the present invention are particularly preferred when full color images are produced. Such precursors are commercially available.

The various materials useful in forming the adhesive layer of the present invention include water soluble thermoplastics or water dispersed thermoplastics, rubbers, acrylic resins, phenolic resins, etc.

These materials can be used alone or in blends formulated to obtain the necessary balance of peel adhesion, cohesive forces, and surface tack. Particularly preferred are carboxylated styrene-butadiene latices, polyvinyl acetate emulsions, emulsions of surlyn-type resins (manufactured by DuPont), low Tg ionomers such as PETAFLEX 56220 (manufactured by Whittacker Corp.), acrylic emulsions such as FLEXCRYL 1625 and FLEXCRYL 1653 (manufactured by Air Products), RHOBOND series (manufactured by Rohm and Haas), RHOPLEX series (manufactured by Rohm and Haas), and core-shell particles such as described in U.S. Pat. Nos. 4,853,364 and 4,877,767.

Those skilled in the art will appreciate that the performance properties of the third or adhesive layer can be modified and optimized by the addition of various other materials such as tackifying resins, plasticizers, and fillers. Particularly preferred tackifiers include rosins and their derivatives, e.g. FORAL 85 (manufactured by Hercules, Inc.), SNOWTACK series (manufactured by Tenneco), rosin acid esters such as AQUATAC 6025 and 6085 (manufactured by Arizona Chemical); phthalate esters such as CELLOLYN 21 (manufactured by Hercules, Inc.), polyvinyl ethers, terepene resins, aromatic and aliphatic hydrocarbon resins, e.g., PICCOTEX LC (manufactured by Hercules, Inc.) and PICCOTAC 95 (manufactured by Hercules, Inc.).

Preferred plasticizers include polybutene, paraffin oils, mineral oils, LEUCOPHOR L (manufactured by Sandoz Chemicals) and monomeric phthalates such as dibutyl phthalate and dioctyl phthalate.

Preferred fillers include clay, silica, calcium carbonate, zinc oxide, pigments, titanium dixoide, chalk, ground quartz, and glass beads.

Particularly preferred combinations of materials include phenolic developer resins with rosin acid esters such as the AQUATAC series, emulsions of core-shell particles with monomeric phthalates, phenolic developer resins with acrylic emulsions, emulsions of core-shell particles with acrylic emulsions, and emulsions of core-shell particles with rosin acid esters.

The present invention is more fully illustrated by the following non-limiting example.

EXAMPLE

A number of different materials were evaluated as the adhesive layer on top of the machine-coated, double layer single transfer media of the present invention. Table 1 lists the various materials evaluated and includes various physical properties. The first layer consisted of the standard Mead Corporation microcapsule formulation machine coated on clear polyethylene terephthalate at a coat weight of 6 g/m². A second layer of 11 g/m² of HRJ 4542, a developer material manufactured by Schenectady Chemical Inc. was coated on top of the microcapsule layer. A hand draw-down of each adhesive material solution (aqueous) was made with a #12 Meyer bar as a third layer on top of the developer layer. The dried samples were then developed against xerographic bond paper. The resulting images on plain paper were glossed against a PET film at 105° C. in a laminator. The quality of transfer of the developed image to paper was evaluated for each sample. The results are shown in Table 2.

TABLE 1

| Material | Particle Size (Microns) | Tg (DMA)[1] Onset (°C.) | 2nd Peak (°C.) |
|---|---|---|---|
| HRJ 4542 | 1.76, 90% <3.6 | 66 | 100 |
| HEJ 11177[2] | 1.76, 90% <3.6 | 49 | 82 |
| HRJ 11177 w/clay[2] | 1.76, 90% <3.6 | 58 | 83 |
| Core Shell | 0.5–0.8 | | |
| Aquatic 6025 | 2.5 | | |
| Aquatic 6085 | 2.5 | | |
| Flexcryl 1625 | | | |
| Flexcryl 1653 | | | |
| Lytron | 0.7–1.0 | | |
| Leucophor | | | |
| Dibutyl phthalate (DBP) | | | |

[1] Dynamic Mechanical Analysis
[2] Developer resins manufactured by Schenectady Chemical Inc.

TABLE 2

| Material Layer 2 | Material Layer 3 | % Additive | Development Temp., C. | Development Pressure, pli | Development Speed, mm/s | Transfer Results | Comments |
|---|---|---|---|---|---|---|---|
| 1 4542 | 4542/leucophor | 4–15 | 45 | 450 | 25 | Good | 8–12% worked best |
| 2 4542 | C.S./DBP | 0–12 | 40 | 400 | 25 | Very poor | 10% transfer |
| 3 4542 | 4542/C.S. | 40 | 45 | 450 | 25 | Very poor | 10% transfer |
| 4 4542 | MCR | — | 45 | 450 | 25 | Poor | 40% transfer |
| 5 4542 | C.S. | — | 40 | 400 | 25 | Very poor | 10% transfer |
| 6 4542 | 6025 (50%) | — | 45 | 400 | 25 | Very poor | Does not dry |

TABLE 2-continued

| Material Layer 2 | Material Layer 3 | % Additive | Development Temp., C. | Development Pressure, pli | Development Speed, mm/s | Transfer Results | Comments |
|---|---|---|---|---|---|---|---|
| 7 4542 | 6085 (50%) | — | 45 | 400 | 25 | Good | Good transfer |
| 8 4542 | 4542/6025 | 16.6 | 35 | 400 | 25 | Good | Good transfer |
| 9 4542 | 4542/6025 | 26.6 | 35 | 400 | 25 | Very good | Complete transfer |
| 10 4542 | C.S./6025 | 16.6 | 35 | 400 | 25 | Fair | 80% transfer |
| 11 4542 | C.S./6025 | 28.6 | 35 | 400 | 25 | Very good | Complete transfer |
| 12 4542 | 11177 | — | 35 | 400 | 25 | Very good | V. slight pickoff |
| 13 4542 | 11177/Lytron | 30 | 35 | 400 | 25 | Good | No improvement |
| 14 4542 | 11177/1625 | 30 | 35 | 400 | 25 | Good? | Bad development |
| 15 4542 | 11177/1653 | 30 | 35 | 400 | 25 | Good? | Bad development |

Having described the invention in detail and by reference to preferred embodiments thereof, it will be apparent that modifications and variations are possible without departing from the scope of the invention defined in the appended claims.

What is claimed is:

1. A self-contained imaging sheet comprising in order:
   (a) a support;
   (b) a first layer comprising photosensitive microcapsules having an internal phase, said internal phase comprising an image-forming agent and an ethylenically unsaturated compound which undergoes photopolymerization or crosslinking in response to exposure to actinic radiation; and
   (c) a second layer comprising a developer material containing at least one pressure sensitive adhesion promoter, said self-contained imaging sheet being capable of forming images on said plain paper by a process which comprises image-wise exposing said imaging sheet to actinic radiation, forming an image on said developer material, transferring the image-bearing developer layer to said plain paper, and separating said imaging sheet from said plain paper, wherein said image-bearing developer layer remains adhered to said plain paper and said microcapsule layer remains adhered to said support.

2. The imaging sheet of claim 1 wherein said support is transparent to said actinic radiation.

3. A process for forming images on plain paper which comprises image-wise exposing a self contained imaging sheet to actinic radiation, said self contained imaging sheet comprising in order:
   (a) a support;
   (b) a first layer comprising photosensitive microcapsules having an internal phase, said internal phase comprising an image-forming agent and a photosensitive composition which undergoes a physical transformation in response to exposure to actinic radiation; and
   (c) a second layer comprising a developer material, said self contained imaging sheet further comprising a pressure sensitive adhesion member, said adhesion member being incorporated directly into said developer material or provided as a separate layer (d);
   forming an image on said developer material, transferring the image-bearing developer layer to said plain paper, and separating said imaging sheet from said plain paper, wherein said image-bearing developer layer remains adhered to said plain paper and said microcapsule layer remains adhered to said support.

4. The process of claim 3 wherein said exposed imaging sheet is assembled with said plain paper, said assembly being subjected to a uniform pressure to effectively cause simultaneous development of an image on said developer layer and transfer of said developer layer to said plain paper.

5. The process of claim 4 wherein said image-bearing plain paper is subjected to a glossing step.

6. The process of claim 5 wherein said glossing step is conducted at a temperature of about 100 to 150° C.

7. The process of claim 6 wherein said glossing step is conducted in an oven or in a set of glosser rollers.

8. The process of claim 6 wherein said glossing step is conducted against a PET film at about 105° C.

9. The process of claim 3 wherein said support is transparent to said actinic radiation.

10. The process of claim 3 wherein said adhesive member is provided as a separate layer (d).

11. The process of claim 10 wherein said adhesive member comprises a blend of at least two different resinous materials.

* * * * *